United States Patent [19]

Misium

[11] Patent Number: 4,928,018
[45] Date of Patent: May 22, 1990

[54] THERMO-ENHANCED ELECTRON IMAGE PROJECTOR

[75] Inventor: George R. Misium, Richardson, Tex.

[73] Assignee: Texas Instruments, Incorporated, Dallas, Tex.

[21] Appl. No.: 373,360

[22] Filed: Jun. 29, 1989

[51] Int. Cl.$^5$ .......................................... H01J 37/317
[52] U.S. Cl. ................................................. 250/492.2
[58] Field of Search ............ 250/492.24, 492.1, 492.2, 250/492.21, 492.22, 492.23

[56] References Cited

U.S. PATENT DOCUMENTS

| | | | |
|---|---|---|---|
| 3,551,734 | 12/1970 | O'Keeffe et al. | 250/492.24 |
| 3,745,358 | 7/1973 | Firtz et al. | 250/492.24 |
| 4,008,402 | 2/1977 | O'Keeffe et al. | 250/492.24 |
| 4,366,383 | 12/1982 | Sano et al. | 250/492.24 |
| 4,469,949 | 9/1984 | Mori et al. | 250/492.24 |
| 4,608,332 | 8/1986 | Ward | 430/296 |
| 4,634,874 | 1/1987 | Ward | 250/492.2 |
| 4,652,762 | 3/1987 | Ward | 250/492.2 |
| 4,695,732 | 9/1987 | Ward | 250/492.24 |
| 4,705,956 | 11/1987 | Ward | 250/492.2 |
| 4,746,587 | 5/1988 | Nicholas | 250/492.24 |
| 4,789,786 | 12/1988 | Yasuda et al. | 250/492.24 |

OTHER PUBLICATIONS

"An Electron Imaging System for the Fabrication of Integrated Circuits", by O'Keefe Vine & Handy, in *Solid-State Electronics*, vol. 12, pp. 841–848 (1969).

"Electron Beam Duplication of Integrated Optical Circuits and Masks", by Fay et al., in *Optics Communications*, vol. 9, No. 4 (1973) pp. 424–426.

"Developments in Electron Image Projection", by Ward, in *J. Vac. Sci. Technol.*, vol. 16, No. 6, pp. 1830–1833 (1979).

"The Magnetic and Significance of Proximity Effects in Electron Image Projector, Defined Layers", by Nicholas, et al., in *J. Vac. Sci. Technol. B.*, vol. 1, No. 4 (1983), pp. 1020–1022.

"A 1:1 Electron Stepper", by Ward, et al., in *J. Vac. Sci. Technol. B.*, vol. 4, No. 1, pp. 89–104, (1986).

*Primary Examiner*—Janice A. Howell
*Assistant Examiner*—Kiet-T. Nguyen
*Attorney, Agent, or Firm*—Douglas A. Sorensen; Rodney M. Anderson; Melvin Sharp

[57] ABSTRACT

An electron image projector (10) is exposed to a heat source (22) to induce the emission of electrons (20) which flow from a pattern (14) of a mask (12) to a photoresist layer (18) of a substrate (16). An electron field (26) is applied across the substrate (16) and the mask (12) to accelerate the electrons (20) from the pattern (14) to the photoresist layer (18) to form a shape (24) on the photoresist layer (18) which reproduces the shape of the pattern (14). A projection system (28) can be disposed between the substrate (16) and the mask (12) to selectively direct the plurality of electrons (20) from the pattern (14) to the photoresist layer (18).

23 Claims, 2 Drawing Sheets

THERMO-ENHANCED ELECTRON IMAGE PROJECTOR

TECHNICAL FIELD OF THE INVENTION

This invention relates in general to an electron image projector process and apparatus, and in particular to an electron image projector process and apparatus having a thermo-enhanced emitting mask for the generation of electrons.

BACKGROUND OF THE INVENTION

The fabrication of integrated circuits has encountered problems in maintaining submicron precision that must be maintained over a macroscopic distance for lithographic processes. In the past, lithographic processes have used electron beam scanning. Electron beam scanning controls an electron beam which serially scans over the surface of a silicon wafer to create the desired image. This process typically takes several hours for the single electron beam to scan the entire wafer during fabrication. Generally, excellent resolution flexibility is possible when using a single beam instrument; however, the sequential operation can only scan over a limited area. Thus, to scan the entire wafer, a step and repeat sequence must be used with subsidiary alignment markers being picked up in each frame. Throughout most of the fabrication sequence of a typical integrated circuit, a series of fixed and repetitive exposure patterns are required; hence, the process of aligning and serially scanning is time consuming and ineffective for high volume production.

A high resolution electron image projection tube has been investigated for fabricating large arrays of micron sized transistors. See T. W. O'Keefe, J. Vine and R. N. Handy, *An Electron Imaging System for the Fabrication of Integrated Circuits*, Solid-State Electron 12, 841 (1969). In an electron image projector, pattern details are transferred from a mask onto a silicon wafer using electrons as the information carrier. Electron image projectors operate by driving electrons from an air stable photocathode having a surface containing an image of the desired pattern. Subsequently, coaxial electromagnetic fields focus the electron image on the silicon wafer targets. In previously developed electron image projectors, ultra-violet radiation was used to excite electrons which were emitted from the mask to the wafer.

In its operation, electron image projectors are generally arranged as simple diodes with a wafer as the anode and an electron/emitting mask as the cathode. In the prior art, ultraviolet radiation has been used in order to excite the mask. Electrons are emitted through photoenhanced emission; thus, the name Photocathode Electron Projector is used for these machines. Unfortunately, the cost and complexity of tools using this radiation source is excessive and burdensome.

Despite the advancements in electron image projectors, problems have occurred with the method of activating the electrons to be emitted on the silicon wafer from the mask. A need has consequently arisen for an electron image projector that is cost effective and that has improved quality control characteristics that will allow the projector to emit electrons with reliability and controllability.

SUMMARY OF THE INVENTION

In accordance with the present invention, a thermo-enhanced electron image projector is provided which substantially eliminates or reduces the disadvantages and problems associated with prior electron image projectors. Specifically, one aspect of the present invention comprises an electron projector apparatus for emitting electrons from a mask. This mask has an electron-emitting pattern formed on the mask to create the desired image to be transferred onto the photoresist of the substrate. The mask is aligned with a substrate substantially parallel to the mask such that the pattern of the mask faces the substrate. A photoresist layer is formed onto the substrate for receiving subsequent electron emissions. A heat source is applied to the mask for inducing the emission of the electrons from the pattern of the mask to the photoresist layer of the substrate. An electron field source anisotropically accelerates the electrons when a field of approximately 10,000 volts per centimeter is applied across the photoresist and the mask to direct the electrons to form an image onto the photoresist which resembles the pattern. To enhance the alignment of electrons, a magnetic field can be used in conjunction with the electric field.

In fabricating the electron image projector, a pattern is initially formed onto the mask which is preferably tungsten having a layer of alkaline oxide formed thereon. Subsequently, the substrate is aligned substantially parallel to the mask and heat is applied to the mask to induce emission of the electrons from the pattern to the mask. An electron field is applied between the substrate and the mask to accelerate the electrons.

The present invention has the technical advantages of ease of operation and cost effectiveness because the complexity of the masks used with ultraviolet light activation are no longer necessary. Additionally, it is a technical advantage not to be required to coat the mask with a special layer of light sensitive material which is susceptible to ultraviolet rays.

BRIEF DESCRIPTION OF THE DRAWINGS

Other aspects of the invention and their advantages will be discerned after studying the detailed description in conjunction with the drawings in which.

DETAILED DESCRIPTION OF THE INVENTION

A thermo-enhanced electron image projector functions to pattern a detailed image onto the surface of a silicon wafer by utilizing electrons as the imaging device. After the image has been exposed onto the silicon wafer, subsequent steps are used to remove the exposed region from the non-exposed region of the substrate for negative tone resist. The present invention can be used as a positive tone resist. The present invention deals with a method of exciting a pattern formed on a mask to induce the emission of electrons to flow from the pattern to a photoresist layer on a substrate.

Figure 1:
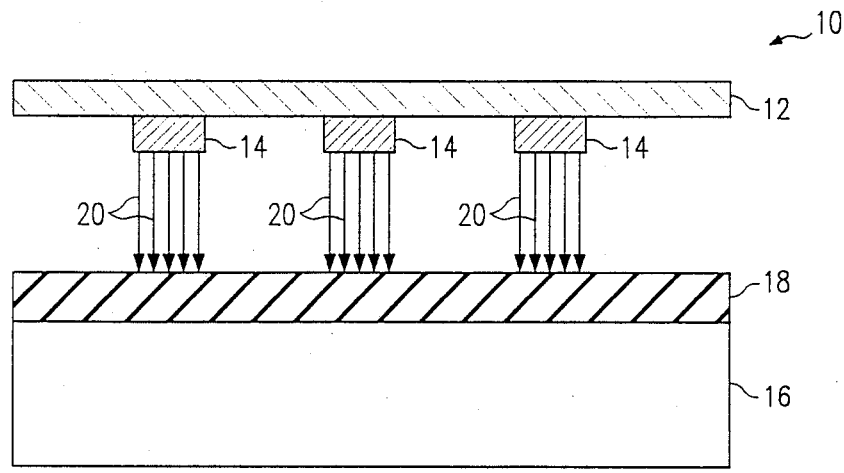
FIG. 1 is an enlarged schematic cross-sectional view of an integrated circuit workpiece illustrating a prior art electron image projector.

Referring to FIG. 1, a prior art electron image projector is shown in an enlarged cross-sectional view and is generally designated 10. Projector 10 comprises a mask 12 which has an electron emitting pattern 14 formed thereon by conventional techniques. The conventional technique generally employed in electron image projectors comprises an ultraviolet light exposed on mask 12 for exciting mask 12 to emit electrons from the transparent areas. The silicon wafer which receives the electron emission can be seen as a substrate 16 having a photoresist layer 18 formed thereon. In its operation, pattern 14 is excited to such a state to allow electrons 20 to transfer from pattern 14 to photoresist layer 18. This operation can be more easily understood by referring to FIG. 2.

Figure 2:
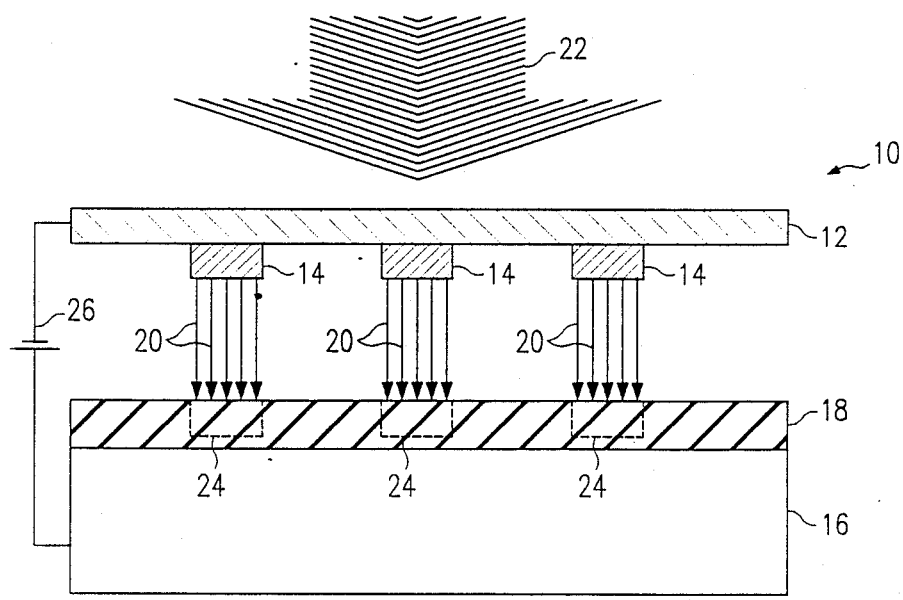
FIG. 2 is an enlarged schematic cross-sectional view of a workpiece shown in FIG. 1, illustrating a subsequent selective exposure of the photoresist to a heat source and an electric field source.

In FIG. 2, and in accordance with the present invention, a heat source diagrammatically represented by arrow 22 is applied to mask 12 and pattern 14 to excite the electron flow and to allow the electrons 20 of the material in pattern 14 to flow away from pattern 14 to photoresist layer 18. In order to control the direction of the electron flow, an electric field source 26 is applied between mask 12 and substrate 16. This electric field source 26 anisotropically accelerates the electrons from pattern 14 to photoresist 18 to form an image 24 on the photoresist 18 which have substantially the same shape as pattern 14. In an alternative embodiment, coils 27 can be incorporated with projector 10 to enhance the alignment of electrons by generating a magnetic field in conjunction with source 26.

Still referring to FIG. 2, in its preferred embodiment, mask 12 and substrate 16 are substantially parallel. Additionally, mask 12 is made of aluminum which has a relatively high heat transfer coefficient. In its preferred embodiment, pattern 14 may be chromium, tungsten, tungsten covered with thorium, or tungsten covered with calcium oxide or a mixture of alkaline oxide. The thermal heat transfer coefficient of aluminum in mask 12 and the material used for pattern 14 are relatively the same to avoid stresses which are formed when the temperature increases in the processing. This design consideration helps avoid warping of the mask by having coefficients which are substantially the same.

In its preferred embodiment, not only is it essential that the thermal expansion of pattern 14 and mask 12 be essentially the same, it is also important that there be good heat transfer between mask 12 and pattern 14 to insure that heat source 22 is effectively induced across the entire surface of pattern 14. Heat source 22 may be from a plurality of sources such as: a furnace, an electrical resistor, or a microwave.

In the present invention, the temperatures across the mask are kept relatively uniform in order to expose the substrate completely. For example, the heat transfer coefficient and the thermal expansion coefficient are major design considerations when considering the materials to be used for mask 12 and pattern 14.

The infrared radiation of the substrate is kept within tolerable levels to insure that there is no background radiation which may create defects. This is not a concern for the lowest temperatures such as those of tungsten $W_o$. Additionally, the thermal expansion of the mask and pattern are designed to expand at approximately the same rate. Generally, mask 12 is designed to carefully reduce the thermal stress between the conductor and the mask substrate.

The method of manufacturing mask 12 and pattern 14 is well known in the art. For example, mask 12 can have a layer of aluminum having a tungsten layer formed thereon. An etching process can subsequently cut away the tungsten of pattern 14 to the desired configuration needed to fabricate the integrated circuit.

Still referring to FIG. 2, in its preferred embodiment, photoresist layer 18 is a Novalak TM composition. Substrate 16 is preferably made of aluminum. It has been found that satisfactory results have been accomplished by applying approximately 10,000 volts per centimeter across substrate 16 and mask 12. Additionally, when using tungsten covered with an alkaline oxide, a temperature of 133 degrees centigrade is desired. In its preferred embodiment, heat source 22 is applied to mask 12 and transferred to pattern 14. Subsequent disclosure will more clearly disclose the operating conditions of the present invention.

Figure 3:
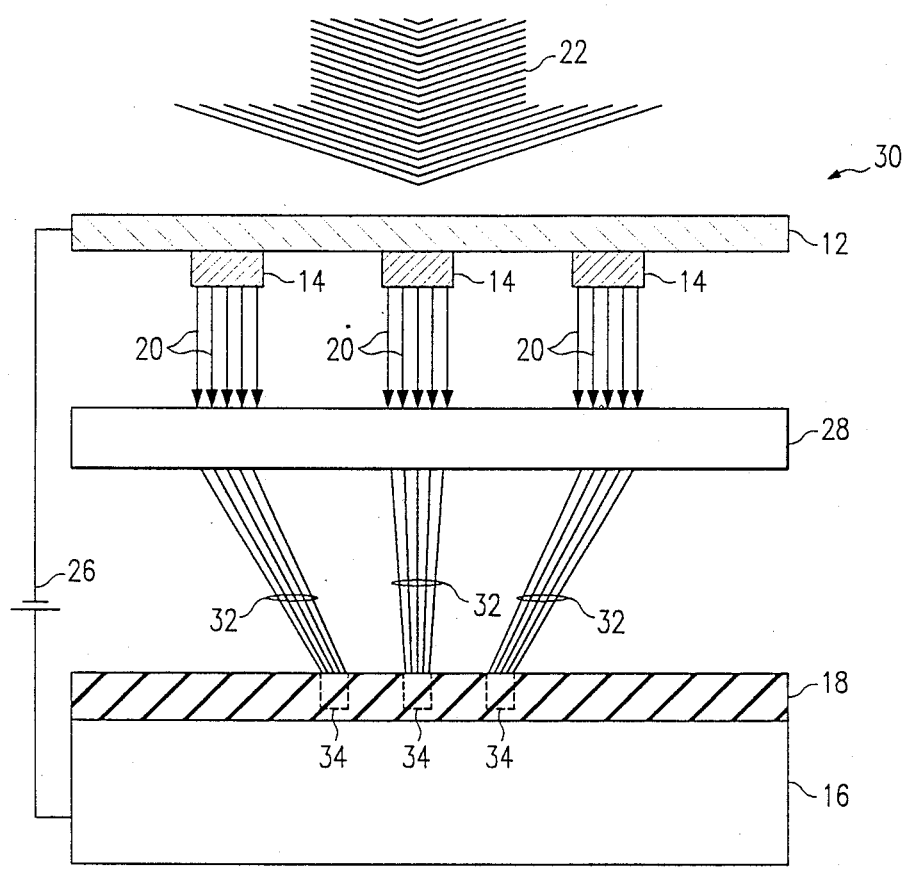
FIG. 3 is an enlarged cross-sectional view of the workpiece of the present invention illustrating an alternative embodiment being exposed to the heat source and the electric field source with an electron optical system.

Referring now to FIG. 3, an alternative embodiment of the present invention can be seen. Specifically, an electron image projector 30 includes projection system 28 located between mask 12 and substrate 16. In its operation, projection system 28 is designed to focus the direction of the electrons to specific points on photoresist 18. Consequently, electron beams 20 are converted to a plurality of electron beams 32 to impose a focused image 34. Projection system 28 is known in the art and has been disclosed in prior publications and inventions. See R. Ward, A. R. Franklin, I. H. Lewin, P. A. Gould and J. J. Plummer, *A 1:1 Electron Stepper*, J. Vac. Sci. Technol. B4(1), January/February 1986. As the preferred embodiment disclosed in FIG. 2, heat source 22 is applied to mask 12 and pattern 14 to induce the emission of electrons 20 from pattern 14 to photoresist layer 18 of substrate 16.

Figure 4:
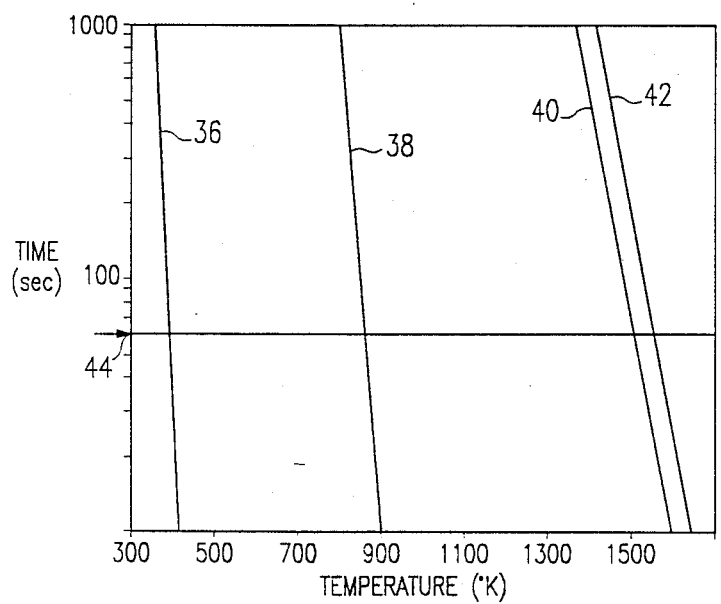
FIG. 4 is a graph illustrating the relationship of time versus temperature of various materials used as the pattern material of the mask of the present invention.

Referring now to FIG. 4, a graph illustrates the temperature with respect to time when using various materials for the pattern connected to the mask. It has been found that the exposure time of this technology depends on the mask composition and the temperature. This correlation can be calculated by considering an experimental variation of the Richardson-Dushman equation for the electron current escaping a metal;

$$J = A_o T^2 e^{-E_w/KT}$$

where J is the electron escaping current, T is the temperature of the metal and the typical values of $A_o$ and $E_w$ are generally:

| Material | $A_o[A/cm^2{}^\circ k^2]$ | $E_w[eV]$ |
|---|---|---|
| Cr | 48 | 4.60 |
| W | 60 | 4.52 |
| $W_t$ | 400 | 2.6 |
| $W_o$ | 50 | 1.1 |

$W_t$ and $W_o$ represent tungsten specially treated to lower its work function. Specifically, Wt indicates tungsten covered with a single layer of thorium atoms, while $W_o$ refers to tungsten covered with a mixture of alkaline earth oxide (such as calcium oxide). From the equation, the values of A and $E_w$ were plugged in to create the plots of FIG. 4.

It can be seen that an exposure time of lines 42 and 40 is extremely long if the mask is kept at very high temperatures where line 40 represents tungsten and line 42 represents chromium. However, at those high temperatures, the mask would expand considerably and underlying substrates would receive an extensive amount of radiating heat. Nevertheless, specially designed tungsten offers the possibility of acceptable exposure times at medium temperatures or low temperatures. For example, the exposure can be performed in one minute as indicated by one minute arrow 44, for thoriated tungsten at 588 degrees centigrade or for tungsten covered with alkaline oxide at 133 degrees centigrade which are shown by lines 38 and 36, respectively.

The exposure time can be further reduced by increasing the applied electrical field, which tends to lower the potential barrier of the electrons. This effect of increasing the electrical field was not taken into account in the preparation of FIG. 4. Instead, the voltage was kept at a constant 10,000 volts per centimeter in the calculation of the graphs.

In summary, an advantageous electron image projector has been disclosed that features the use of thermal enhanced mask emitting source for inducing the electron flow to the photoresist of a substrate. The process of the invention infers significant advantages in terms of high resolution, increased throughput, better uniformity, and reduced complexity.

While the preferred embodiment of the present invention and their advantages have been disclosed in the above detailed description, the invention is not limited thereto but only by the spirit and scope of the appended claims.

What is claimed is:

1. An electron image projecting apparatus for emitting electrons from a mask to a substrate, which comprises:
    an electron-emitting pattern formed adjacent the mask; and
    a heat source applied to said pattern to provide a sufficient heat level for inducing the emission of electrons from said pattern to said substrate.

2. The apparatus of claim 1 and further comprising an electric field source for anisotropically accelerating the electrons from said pattern to said substrate to form an image on said substrate having substantially the same shape as said pattern.

3. The apparatus of claim 1, wherein the mask and said substrate are substantially parallel.

4. The apparatus of claim 1, wherein said pattern is selected from the group consisting of chromium, tungsten, tungsten covered with thorium, tungsten covered with calcium oxide, or tungsten covered with a mixture of alkaline earth oxide and mixtures thereof.

5. The apparatus of claim 1, wherein said mask is aluminum.

6. The apparatus of claim 1, wherein said heat source is applied to the mask for transferring heat to said pattern.

7. The apparatus of claim 2, wherein said voltage applied is approximately 10,000 volts.

8. The apparatus of claim 1, wherein said heat applied to said pattern raises temperature to between approximately 120 and approximately 150 degrees centigrade.

9. The apparatus of claim 1, wherein the mask and said pattern have relatively the same thermal expansion coefficients.

10. The apparatus of claim 2, further comprising coils incorporated in the apparatus for enhancing the alignment of electrons by generating a magnetic field in conjunction with said electric field source.

11. An electron image projecting apparatus for emitting electrons, which comprises:
    a mask;
    an electron-emitting pattern formed on said mask to create an image;
    a substrate aligned substantially parallel to said mask such that said pattern faces said substrate;
    a photoresist layer formed on said substrate;
    a heat source applied to said mask for inducing the emission of electrons from said pattern of said mask to said photoresist layer of said substrate; and
    an electric field source for accelerating electrons from said pattern to said photoresist layer to react with said photoresist layer to form the shape of said image on said photoresist layer.

12. The apparatus of claim 11, further comprising a projection system placed between said mask and said substrate for selectively directing the plurality of electrons to said photoresist layer.

13. The apparatus of claim 11, wherein said pattern is selected from the group of chromium, tungsten, tungsten covered with thorium, tungsten covered with calcium oxide, or tungsten covered with a mixture of alkaline earth oxide and a mixture thereof.

14. The apparatus of claim 11, wherein said mask is aluminum.

15. The apparatus of claim 11, wherein said electric field source applies approximately 10,000 volts per centimeter across said substrate and said mask.

16. The apparatus of claim 11, wherein said heat applied raises said pattern temperature to approximately 133 degrees centigrade.

17. The apparatus of claim 11, wherein said mask and said pattern have relatively the same thermal expansion coefficient.

18. An electron image projecting process for emitting electrons from a pattern formed on a mask to a substrate comprising the steps of:
    heating the pattern on the mask to a sufficient level to induce the emission of the electrons from the pattern; and
    directing said electrons to said substrate.

19. The process of claim 18, further comprising the step of:
    applying an electrical field source between the substrate and the mask to accelerate the electrons from the pattern to the substrate to form an image on the substrate having substantially the same shape as the pattern.

20. The process of claim 18 further comprising the step of:
    focusing the electron flow through a projection system to selectively direct the plurality of electrons from the pattern to the substrate.

21. The process of claim 19, further comprising the step of:
    generating a magnetic field for enhancing the alignment of electrons.

22. An electron image projecting process for emitting electrons from a pattern on a mask to a photoresist layer of a substrate comprising the steps of:
    forming an electron-emitting pattern on the mask;
    aligning the substrate substantially parallel to the mask;

heating the mask to induce emission of electrons from the pattern to the mask; and applying an electric field between the substrate and the mask to accelerate the electrons from the pattern to the photoresist layer to form an image on the photoresist layer having substantially the same shape as the pattern.

23. The process of claim 22, further comprising the step of focusing the electron flow through a projection system to selectively direct the plurality of electrons from the mask to the photoresist layer.

* * * * *